United States Patent [19]
Sone

[11] Patent Number: 5,914,488
[45] Date of Patent: Jun. 22, 1999

[54] INFRARED DETECTOR

[75] Inventor: Takanori Sone, Tokyo, Japan

[73] Assignee: Mitsubishi Denki Kabushiki Kaisha, Tokyo, Japan

[21] Appl. No.: 08/811,166

[22] Filed: Mar. 4, 1997

[30]    Foreign Application Priority Data

Mar. 5, 1996  [JP]  Japan ..................................... 8-47403
Oct. 11, 1996  [JP]  Japan ..................................... 8-269671

[51] Int. Cl.⁶ ....................................................... G01J 5/04
[52] U.S. Cl. ........................ 250/338.1; 250/332; 250/352
[58] Field of Search ................................ 250/332, 338.3, 250/352, 353, 338.1, 338.4, 338.2, 349, 370.08, 239

[56]           References Cited

U.S. PATENT DOCUMENTS

| | | | |
|---|---|---|---|
| 4,143,269 | 3/1979 | McCormack et al. | 250/332 |
| 4,485,305 | 11/1984 | Kuwano et al. | 250/338.1 |
| 4,695,719 | 9/1987 | Wilwerding . | |
| 5,041,723 | 8/1991 | Ishida et al. | 250/352 |
| 5,229,612 | 7/1993 | Pompei et al. | 250/349 |
| 5,401,968 | 3/1995 | Cox | 250/353 |
| 5,420,419 | 5/1995 | Wood . | |
| 5,541,412 | 7/1996 | Tanaka et al. | 250/332 |
| 5,550,373 | 8/1996 | Cole et al. | 250/339.02 |
| 5,701,008 | 12/1997 | Bay et al. | 250/349 |

FOREIGN PATENT DOCUMENTS

| | | |
|---|---|---|
| 0 175 418 A2 | 3/1986 | European Pat. Off. . |
| 0 556 156 A1 | 10/1993 | European Pat. Off. . |
| 0 664 554 A1 | 7/1995 | European Pat. Off. . |
| 2-196929 | 8/1990 | Japan . |
| 4-500437 | 1/1992 | Japan . |
| 4-158586 | 6/1992 | Japan . |
| 6-3184 | 1/1994 | Japan ................................. 250/338.3 |
| 7-243908 | 9/1995 | Japan . |
| 1290 990 | 9/1972 | United Kingdom . |
| 2 090 054 A | 6/1982 | United Kingdom . |
| WO 94/00950 | 1/1994 | WIPO . |
| WO 95/17014 | 6/1995 | WIPO . |

OTHER PUBLICATIONS

Toshio Kanno et al., "Uncooled infrared focal plane array having 128+128 thermopile detector elements," *Infrared Technology XX (1994)*, SPIE vol. 2269, pp. 450–459.

*Primary Examiner*—Constantine Hannaher
*Assistant Examiner*—Darren M. Jiron
*Attorney, Agent, or Firm*—Burns, Doane, Swecker & Mathis, L.L.P.

[57]           ABSTRACT

An infrared transmission window 4 is placed on the front of a light reception part 2 formed on a substrate 1 with a cavity 3 between and is bonded to the substrate 1 in airtight relation on a bond face in the range surrounding the light reception part 2, whereby the transmission window 4 is fixed and the cavity 3 is evacuated of air.

4 Claims, 8 Drawing Sheets

INFRARED DETECTOR

BACKGROUND OF THE INVENTION

1. Field of the Invention

This invention relates to an infrared detector and more particularly to an infrared detector of an infrared sensing array of a bolometer, thermo pile, or pyroelectric system requiring a vacuum airtight property for a light reception part and an infrared detector of an infrared sensing array of a bolometer system requiring temperature stabilization of a light reception part.

2. Description of the Related Art

In recent years, the use of optical machines with infrared rays has been increasing and has been made in night monitor, temperature measurement, etc. With the increasing range of uses for the optical machines with infrared rays, a demand is made for developing an inexpensive infrared detector made of a thermal detector of a bolometer, thermo pile, or pyroelectric system. For example, an infrared sensing array of a bolometer system with detector pixels suspended in bridge structures as described in Japanese Patent Laid-Open No. Hei 2-196929 or 4-500437, an infrared sensing array of a thermo pile system described on pages 450–459 of SPIE Proceedings Vol. 2269 Infrared Technology XX, (1994), or an infrared sensing array of a pyroelectric system described in Japanese Patent Laid-Open No. Hei 7-243908 is an infrared detection element comprising infrared ray sensing pixels formed like an array on a silicon substrate. The elements enable infrared rays to be sensed as images. The thermal detectors, which do not require element cooling as compared with infrared image detectors of quantum type, have the advantage that they can provide infrared detectors at low costs.

However, the thermal detector converts incident infrared rays absorbed at a light reception part into temperature change of the light reception part and detects it as a signal. Thus, the thermal insulation property of the light reception part needs to be enhanced to provide a highly sensitive detector. In the prior art, to obtain a high thermal insulation property, pixels of a light reception part are suspended in bridge structures and the whole substrate forming a detection element is placed in a vacuum vessel. A vacuum vessel, also called a vacuum package, is provided, for example, as shown in FIG. 14: An infrared detection element 20 is bonded to a ceramic stem (base) 15 and a cap 16 with an infrared transmission window 4 is placed on the front of the detection element 20 and is bonded to the stem 15 in airtight relation. The cap 16 is evacuated of air through an exhaust pipe 17 attached to the cap 16 and the end face of the exhaust pipe 17 is sealed for finally providing a vacuum vessel. A signal of the detection element 20 is connected to a signal pin 19 penetrating an element wiring pad and the stem 15 by wire bond 18, whereby the signal is taken out to the outside of the vessel.

In the method of using such a vacuum vessel (package) to hold the thermal insulation property of a detection element, it is difficult to miniaturize a detector, needless to say, because the whole detector dimensions are determined by the vacuum vessel no matter how small the detection element is made. The detection element mounting process with the vacuum vessel not only is intricate, but also requires expensive parts such as the ceramic stem and large transmission window; it does not necessarily provide a detector at low costs.

The thermal detector of a bolometer system converts absolute temperature change of pixels made by irradiation with infrared rays from the outside into resistance change and reads it. Thus, the temperature of the detector itself needs to be stable independently of change in the ambient temperature of the detector. In the prior art, for example, as shown in FIG. 15, an infrared detection element 20 and a thermoelectric thermo module 22 are bonded and are fixed in a vessel made up of a cap 16 provided with an infrared transmission window 4 and a stem 15 in a similar manner to that shown in FIG. 14, and the vessel is evacuated of air and is sealed. Further, a temperature sensor 23 is located in the proximity of the detection element 20 for sensing the temperature of the detection element 20, and a signal from the temperature sensor 23 is taken out to the outside by a signal pin 19 penetrating the stem 15 and is connected to a temperature controller 24 for controlling the thermoelectric thermo module 22. The temperature controller 24 adjusts current into the thermo module 22 so that the temperature of the detection element 20 holds a predetermined value in response to the signal from the temperature sensor 23.

The thermoelectric thermo module, which generally uses the Peltier effect, can absorb or generate heat according to the amount and direction of energized current for holding the detection element temperature to a predetermined value under the current control of the temperature controller. However, additional circuits and units such as the temperature sensor and the temperature controller for controlling the thermoelectric thermo module are required, causing a hindrance to low costs.

SUMMARY OF THE INVENTION

The present invention has been made to eliminate the above problems with the conventional detector, and therefore an object of the invention is to provide a small-sized and low-cost infrared detector by providing a method of easily obtaining a vacuum airtight property to provide a light reception part with a thermal insulation property for a thermal infrared sensing array and a method of easily stabilizing temperature for an infrared sensing array of a bolometer system.

To the end, according to the invention, there is provided an infrared detector comprising an infrared sensing array of a bolometer, thermo pile, or pyroelectric system formed with a light reception part on a substrate wherein an infrared transmission window is placed on the front of the light reception part with a cavity between and is bonded to the substrate in airtight relation on a bond face completely surrounding the light reception part, whereby the transmission window is fixed and the cavity is evacuated of air.

In the infrared detector of the invention, the infrared transmission window placed on the front of the light reception part with a cavity between is silicon ground on both faces in the thickness range of 0.1 mm to 1.5 mm.

In the infrared detector of the invention, the infrared transmission window placed on the front of the light reception part with a cavity between is ground on both faces in the thickness range of 0.1 mm to 1.5 mm with both the faces each coated with a reflection prevention film.

In the infrared detector of the invention, the infrared transmission window placed on the front of the light reception part with a cavity between is bonded to the substrate formed with the light reception part in airtight relation by solder, evaporation, etc.

In the infrared detector of the invention, the degree of vacuum of the cavity between the infrared transmission window and the substrate formed with the light reception part is $1 \times 10^{-2}$ torr or less.

In the infrared detector of the invention, the infrared transmission window placed on the front of the light reception part with a cavity between is formed with microlenses provided in a one-to-one correspondence with pixels of the infrared sensing array and infrared rays incident on the detector are gathered on the pixels through the microlenses.

According to the invention, there is provided an infrared sensor comprising a substrate formed with an infrared sensing array of a bolometer system, a positive temperature coefficient thermistor disposed on the substrate, and a vessel being made up of a cap with an infrared transmission window and a stem for fixing the substrate and the thermistor within the vessel, the vessel being evacuated of air.

According to the invention, there is provided an infrared sensor comprising a substrate formed with an infrared sensing array of a bolometer system, a vessel being made up of a cap with an infrared transmission window and a stem for fixing the substrate within the vessel, and a positive temperature coefficient thermistor disposed on the bottom of the stem, the vessel being evacuated of air.

According to the invention, there is provided an infrared detector comprising an infrared sensing array of a bolometer system as a light reception part formed on a first face of a substrate having two faces, wherein an infrared transmission window is placed on the front of the light reception part with a cavity between and is bonded to the substrate formed with the light reception part in airtight relation on a bond face completely surrounding the light reception part, whereby the transmission window is fixed and the cavity is evacuated of air, and wherein a positive temperature coefficient thermistor is bonded to a second face of the substrate.

In the infrared detector of the invention, the sudden resistance change temperature range of the positive temperature coefficient thermistor is 40 to 90° C.

In the invention, a silicon substrate is used as the substrate.

The above and other objects and features of the present invention will be more apparent from the following description taken in conjunction with the accompanying drawings.

DETAILED DESCRIPTION OF THE PREFERRED EMBODIMENTS

Now, a description will be given in more detail of preferred embodiments of the present invention with reference to the accompanying drawings.

(Embodiment 1)

Figure 1:
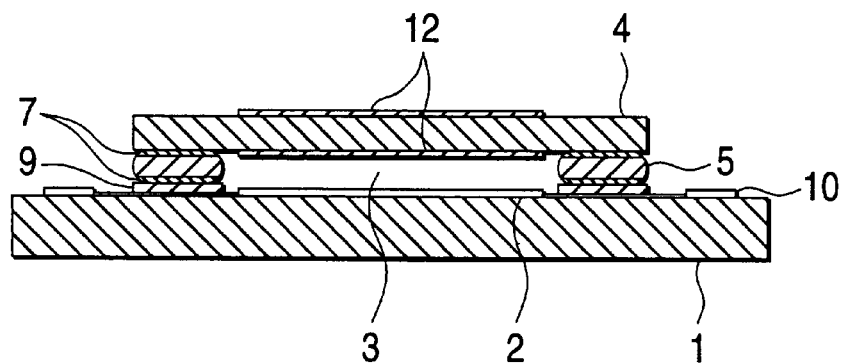
FIG. 1 is a sectional view to show the structure of a first embodiment of an infrared detector of the invention.
Figure 2:
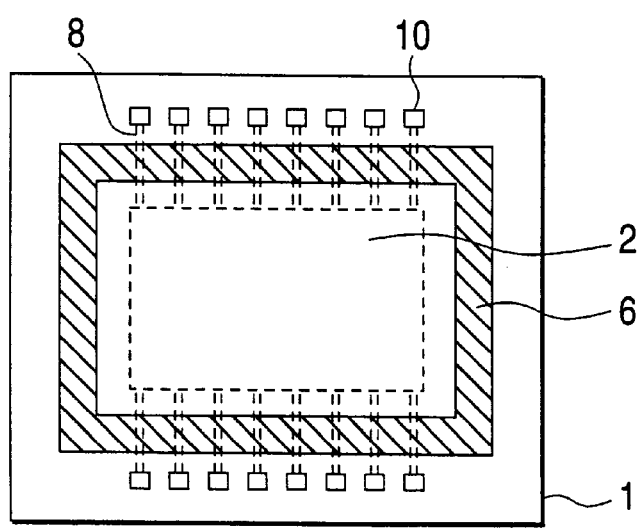
FIG. 2 is a top view of the first embodiment of the infrared detector of the invention.

FIG. 1 is a sectional view to show an infrared detector according to a first embodiment of the invention. The infrared detector according of the first embodiment of the invention comprises an infrared transmission window 4 bonded to a substrate (for example, a silicon substrate) with a cavity between by solder 5 on the front of an infrared light reception part 2 of thermal type formed on the silicon substrate 1. FIG. 2 is a top view of the infrared detector in FIG. 1. The transmission window 4 is bonded on a bond face 6 completely surrounding the infrared light reception part 2 for sealing the light reception part 2 in airtight relation. For the bond face 6 of the transmission window 4 and the solder 5 of the silicon substrate 1, the transmission window 4 and the silicon substrate 1 are previously coated with a metalization layer 7 to promote solderability. The bond face 6 of the silicon substrate 1 extends over wiring 8 for taking out a signal; to prevent damage at the bonding time, the portion of the silicon substrate corresponding to the bond face 6 is previously coated with a silicon oxide film 9 as a protective film. Next, the cavity 3 between the transmission window 4 and the silicon substrate 1 needs to be evacuated of air as follows: First, before the transmission window 4 and the silicon substrate 1 are bonded, solder is placed on the transmission window and a heat treatment is executed in a hydrogen atmosphere, whereby the oxide film of solder is removed and the solder is bonded to the metalization layer 7 on the light reception face side. Subsequently, temperature is lowered until the solder hardens and the solder on the transmission window 4 and the metalization layer on the silicon substrate 1 are aligned. Then, a heat treatment is executed in a vacuum and the transmission window 4 and the silicon substrate 1 are bonded in airtight relation. Since the solder oxide film is previously removed in the hydrogen atmosphere, the solder is well bonded without using a solder flux. Since the transmission window 4 and the silicon substrate 1 are bonded in airtight relation in a vacuum, the cavity 3 is maintained under vacuum. A light reception element with the light reception part 2 sealed in airtight relation in a vacuum is thus provided. A pad 10 and the wiring 8 in FIG. 2 are drawn to show the features of the invention; the sizes and numbers thereof differ from those in the actual first embodiment.

Figure 3:
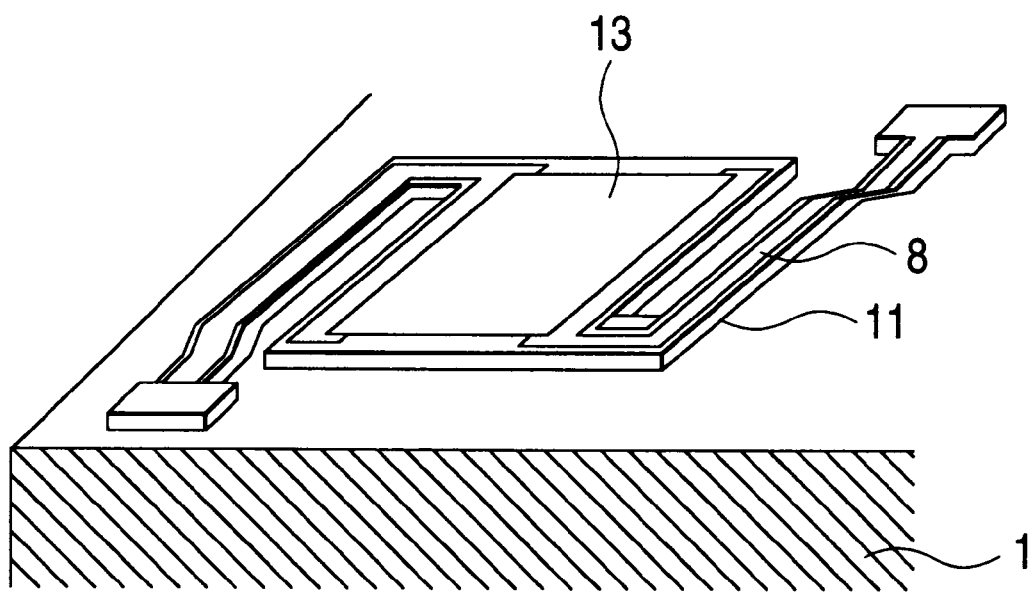
FIG. 3 is a perspective view of a pixel of a light reception part used with the first embodiment of the invention.
Figure 4:
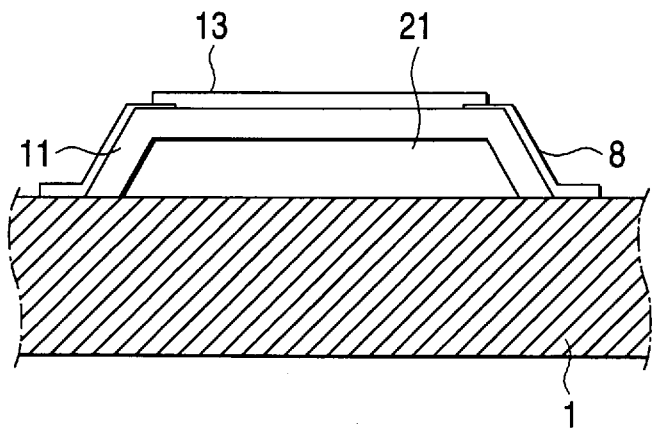
FIG. 4 is a sectional view of the pixel of the light reception part used with the first embodiment of the invention shown in FIG. 3.
Figure 5:
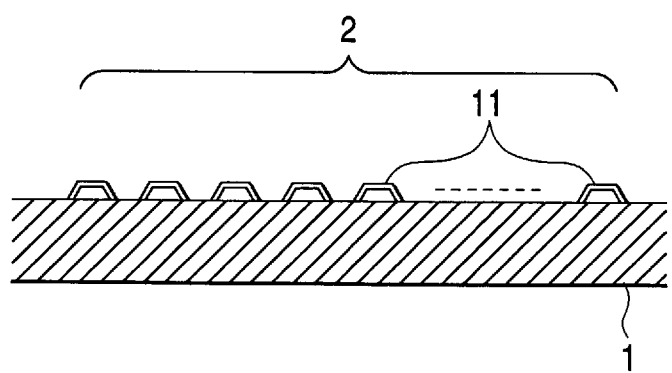
FIG. 5 is a sectional view to show the array state of the light reception part used with the first embodiment of the invention on a substrate.

The infrared light reception part 2 of the first embodiment forms bridge structures 11 each with two support legs as shown in FIG. 3. FIG. 4 is a sectional view of the bridge structure. A plurality of the bridges 11 each formed with a thermal insulating gap 21 having a thermal infrared sensing circuit placed on the top are arranged like an array on the substrate as shown in FIG. 5. The bridges are provided in a one-to-one correspondence with pixels. The sensing circuit, which contains a bolometer resistor 13, converts temperature changed when an infrared ray is absorbed on the bridge top into a resistance change and detects a signal through wiring 8 placed on the substrate along the support legs of the bridge structure from electrodes at both ends of the bolometer. For the infrared detector of this system, the thermal insulating property of the sensing circuit is important and the surroundings of the bridge 11 containing the gap 21 are placed in a vacuum state. The light reception part of the bolometer system is an example of the invention and the invention can also produce a similar effect with a reception part of the thermo pile or pyroelectric system whose thermal insulating property is important, needless to say.

Since infrared radiation from a human body or a room-temperature body has a peak in the proximity of wavelength 10 $\mu$m, the infrared transmission window 4 can use any material such as germanium, silicon, zinc sulfide, or zinc selenide capable of transmitting 10-$\mu$m infrared rays. Above all, silicon is available comparatively inexpensively as a low-cost material among the infrared transmission materials and is the same material as the substrate to which the transmission window is bonded for providing high reliability of bonding the transmission window without mismatch of thermal expansion.

However, if the silicon transmission window is made too thin, it is largely deformed due to the vacuum cavity between the transmission window and the substrate to which the window is bonded. In the first embodiment, the silicon transmission window 4 is sized 20×20 mm and if it is changed in thickness, the maximum deformation amount at the center of the window 0.1 mm thick is about 0.1 mm; if the window is thinned more than the value, the deformation amount abruptly increases. Therefore, it is desirable to set the lower limit of the thickness of the silicon transmission window 4 to 0.1 mm or more. Since silicon absorbs infrared rays in the proximity of wavelength 9 $\mu$m, it is not preferable to thicken the silicon window too much. In the embodiment, when the silicon transmission window 4 ground on both faces is 1.5 mm thick, the average absorption percentage of wavelengths 8–12 $\mu$m becomes 9.7%. To prevent sensitivity from being degraded as the infrared transmission factor decreases, it is desirable to set the average absorption percentage in the wavelength band of 8–12 $\mu$m to 10% or less. Therefore, preferably the upper limit of the thickness of the silicon transmission window 4 is set to 1.5 mm.

Figure 7:
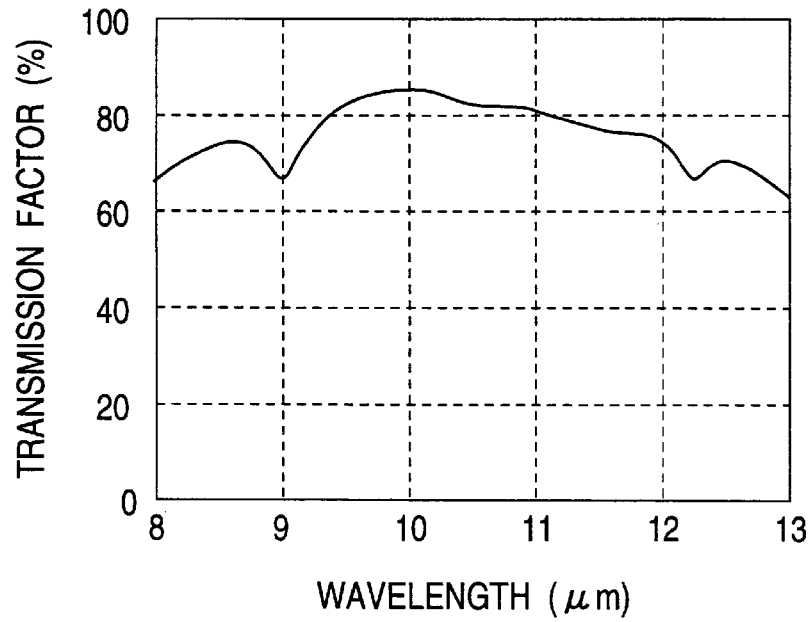
FIG. 7 is a graph to show the transmission factor of an infrared transmission window coated with reflection prevention films used with the first embodiment of the invention.

On the other hand, if silicon is used as the infrared transmission window 4 intact, it is a material having a high refractive index characteristic, thus has a large reflection loss and is not preferred for the sensitivity of the detector. In the first embodiment, both faces of silicon are coated with a film of zinc sulfide 1.1 $\mu$m thick by a vacuum evaporation method, forming reflection prevention films 12, whereby the transmission factor at wavelength 10 $\mu$m becomes 85% at a silicon transmission window 1 mm thick as shown in FIG. 7.

The infrared transmission window 4 is bonded to the silicon substrate 1 by soldering, glass frit, thermocompression, or the like. The glass frit generally is high in treatment temperature and is hard to bond in airtight relation at less than heat resistance temperature of the infrared detection element. For the thermocompression, a vacuum airtight property is difficult to provide because of a substrate surface level difference slightly occurring when the transmission window bonding part strides across the wiring 7. On the other hand, solder bonding produces the result in mounting process of silicon elements such as memories and logics and is enabled at bond temperature less than the heat resistance temperature of the element, needless to say. Since the solder bonding executed in the first embodiment provides thick bank structure at the bond place as shown in FIG. 1, a sufficient height can be taken for the cavity 3 between the transmission window 4 and the silicon substrate 1 only by soldering and in addition, the level difference caused by the wiring on the substrate can be absorbed. Three layers of tungsten 3000 Å, nickel 3000 Å, and gold 1000 Å are metalized on the solder bonding face 6 of the transmission window 4 and the silicon substrate 1 in order from the ground side by a sputtering system to provide good solderability. Lead-tin family solder is used. At the beginning, a thermal treatment is executed at 350° C. in a hydrogen atmosphere for removing (reducing) oxidation of the solder, then bonding is performed at temperature 350° C. in a vacuum state of $1 \times 10^{-2}$ torr or less. To prevent damage when the solder bonding part 6 strides across the wiring on the silicon substrate, the solder bonding part 6 is previously coated with a protective film of silicon oxide 4000 angstroms thick.

Figure 8:
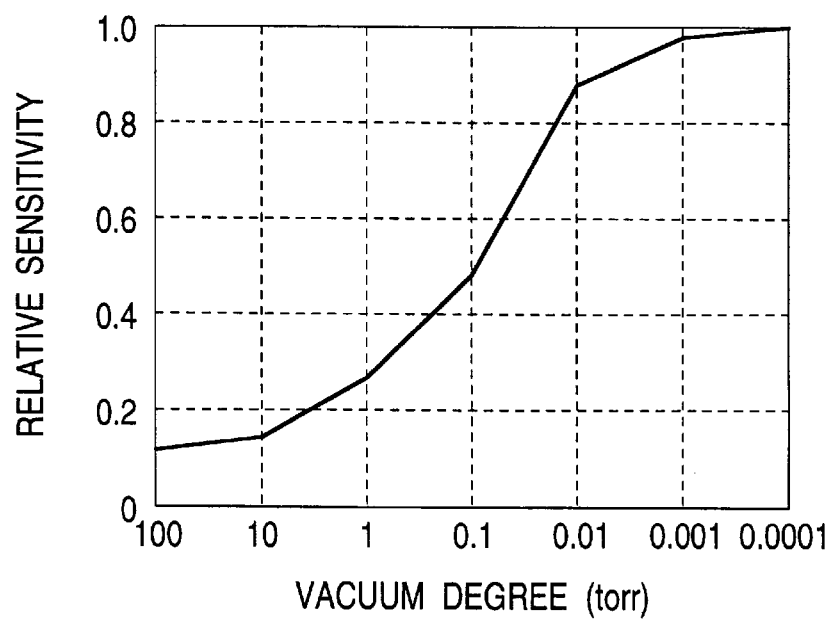
FIG. 8 is a graph to show the degree of vacuum and sensitivity.

The degree of vacuum in the surroundings of the light reception part of the element is important for providing a high thermal insulation property. The degree of vacuum is sensed according to an indication value of a vacuum gauge in a thermostatic oven used when the transmission window 4 and the silicon substrate 1 are bonded. Seeing the correlation between the degree of vacuum and sensitivity assuming that the relative sensitivity when the degree of vacuum is sufficiently raised is 1 in the infrared detector in the first embodiment, as shown in FIG. 8, the sensitivity does not largely decrease until $1 \times 10^{-2}$ torr, but is abruptly degraded if the degree of vacuum worsens exceeding the value. That is, preferably the degree of vacuum is at least $1 \times 10^{-2}$ torr or less.

(Embodiment 2)

Figure 6:
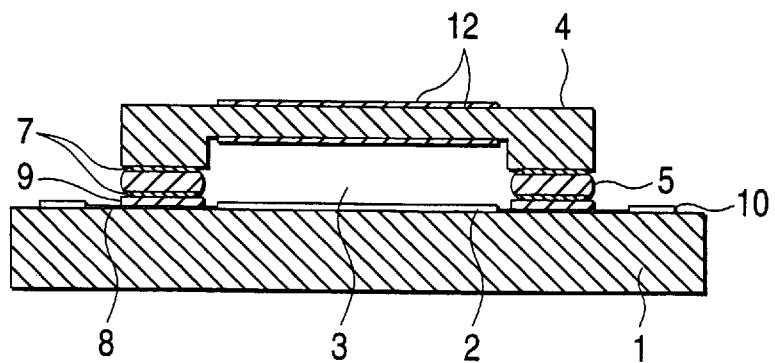
FIG. 6 is a sectional view of an infrared detector with an infrared transmission window of a different shape in a second embodiment of infrared detector of the invention.

FIG. 6 shows a second embodiment of the invention. The second embodiment is the same as the first embodiment except for the shape of transmission window 4. Therefore, the same effect of a thermal insulation property provided by vacuum surrounding a light reception part of a detection element can be expected. A bonding part of a transmission window 4 to a substrate 1 surrounding the transmission window 4 is made convex. In this case, the processing cost of the transmission window 4 rises, but the transmission window 4 and the silicon substrate 1 can be spaced sufficiently from each other, so that the invention can be applied even to infrared detectors having a high light reception part. Since the thickness of a solder bank is not required to provide the height of a cavity 3, the cohering area and thickness of solder can be lessened.

(Embodiment 3)

Figure 9:
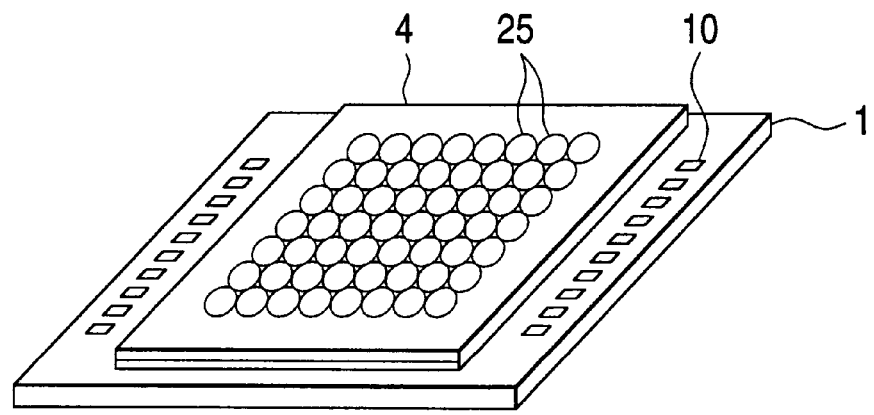
FIG. 9 is a perspective view of an infrared detector with microlenses processed on an infrared transmission window in a third embodiment of infrared detector of the invention.
Figure 10:
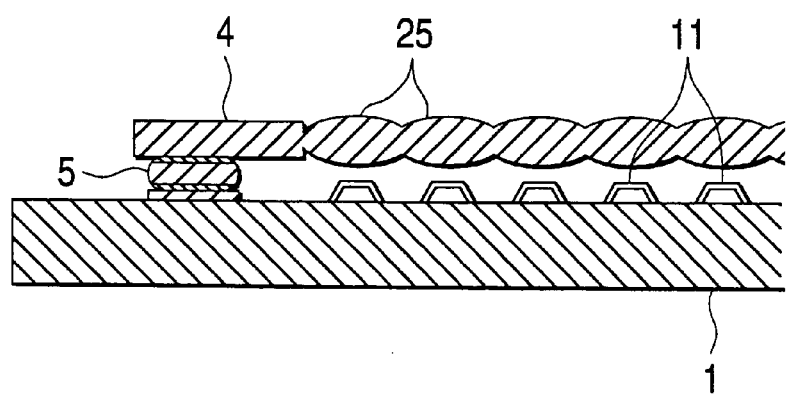
FIG. 10 is a sectional view of the infrared detector shown in FIG. 9.

FIG. 9 shows a third embodiment of the invention. In the third embodiment, a transmission window 4 is formed with microlenses provided in a one-to-one correspondence with pixels of a light reception part. FIG. 10 is a sectional view of the third embodiment. Since the transmission window 4 is bonded to a silicon substrate as in the first embodiment, the same effect of a thermal insulation property provided by vacuum surrounding the light reception part of a detection element can be expected.

The microlenses 25 of the third embodiment are processed by dry etching so as to come into a focus on each pixel. Therefore, the microlenses enhance the light-gathering capability of each pixel, so that the sensitivity of the detection element improves.

(Embodiment 4)

Figure 11:
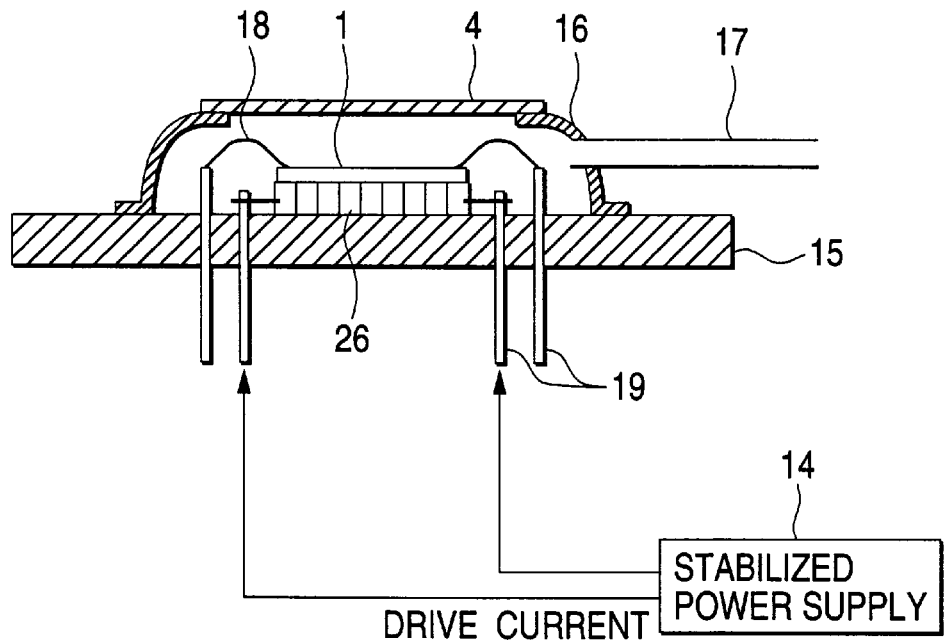
FIG. 11 is a sectional view of an infrared detector for temperature stabilization in a fourth embodiment of infrared detector of the invention.

FIG. 11 shows a fourth embodiment of the invention. To form an infrared detector of the fourth embodiment of the invention, a positive temperature coefficient thermistor 26 is bonded to a silicon substrate 1 formed with an infrared sensing array of a bolometer system used as an infrared detection element and both the silicon substrate 1 and the thermistor 26 are fixed to the inside of a vessel made up of a cap 16 with an infrared transmission window 4 and a stem 15. The infrared detection element is equivalent to that shown in FIG. 3. The vessel is evacuated of air through an exhaust pipe 17 attached to the cap 16 and the end face of the exhaust pipe 17 is sealed for finally producing a vacuum in the vessel. Lead lines for supplying drive current of the thermistor 26 and signal read lines of the detection element are connected to signal pins 19 penetrating the stem 15, whereby they are taken out to the outside of the vessel. A predetermined voltage is applied to the thermistor 26 from a stabilized power supply 14.

The positive temperature coefficient (PTC) thermistor is a kind of semiconductor; the resistance value of the semiconductor lowers gradually with a temperature rise, but when one temperature is reached, abruptly the resistance increases. When a given voltage is applied to the thermistor, the thermistor temperature rises at the beginning because the resistance value lowers due to self-heat generation. However, when one temperature (sudden resistance change temperature) is reached, abruptly the resistance increases and the current decreases and heat generation power and the thermistor temperature become constant. According to this principle, the positive temperature coefficient thermistor has a feature of becoming a constant temperature heat generation body simply upon application of a given voltage without using a temperature controller, etc.

In the embodiment, a PTC thermistor having sudden resistance change temperature 60° C. manufactured by TDK is used as the positive temperature coefficient thermistor and 12-V voltage applied from the stabilized power supply is used as a load, whereby the element temperature is stabilized to 58±1° C. over a long term.

(Embodiment 5)

Figure 12:
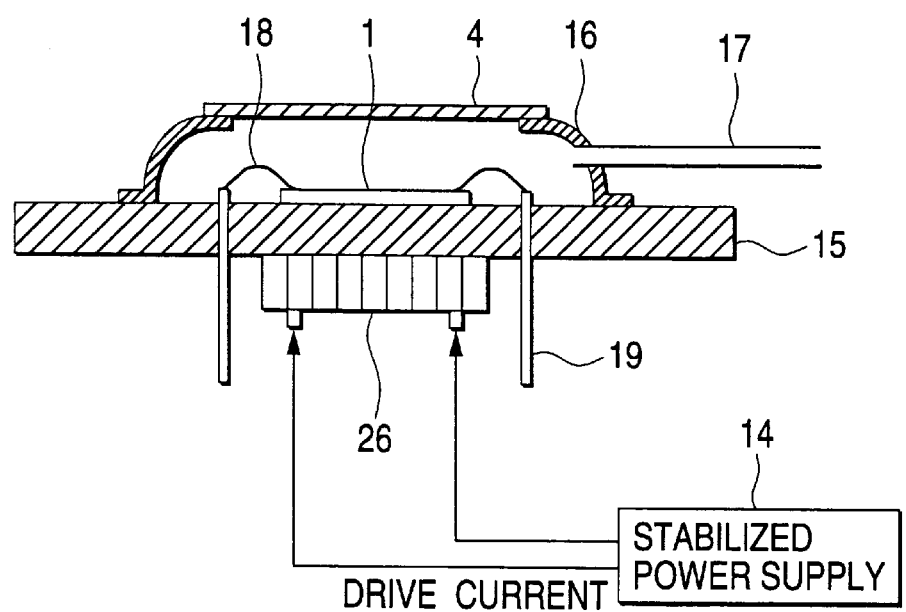
FIG. 12 is a sectional view of an infrared detector for temperature stabilization in a fifth embodiment of infrared detector of the invention.

FIG. 12 shows a fifth embodiment of the invention. Although the positive temperature coefficient thermistor 26 is placed in the vacuum vessel and the silicon substrate 1 of the infrared detection element is directly heated for stabilizing temperature in the fourth embodiment, a positive temperature coefficient thermistor 26 is placed outside a vacuum vessel and a silicon substrate 1 is indirectly heated for stabilizing temperature in the fifth embodiment.

The fifth embodiment is inferior to the fourth embodiment in temperature stabilization efficiency because the silicon substrate 1 is indirectly heated. However, the positive temperature coefficient thermistor 26 may be bonded to the bottom of a stem 15 after a vacuum vessel is assembled, so that the fifth embodiment has the advantages that the thermistor 26 can be replaced and be easily removed.

(Embodiment 6)

Figure 13:
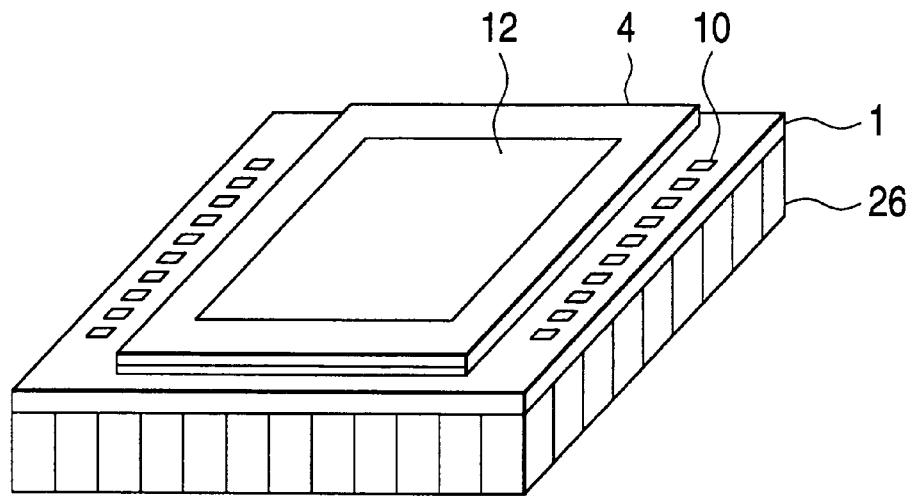
FIG. 13 is a sectional view of an infrared detector for temperature stabilization in a sixth embodiment of infrared detector of the invention.
Figure 14:
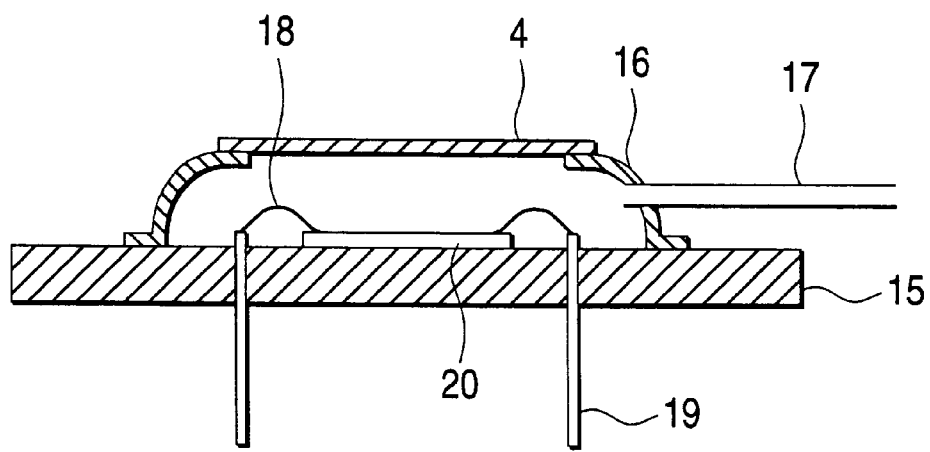
FIG. 14 is a sectional view to show a vacuum vessel in a conventional example.
Figure 15:
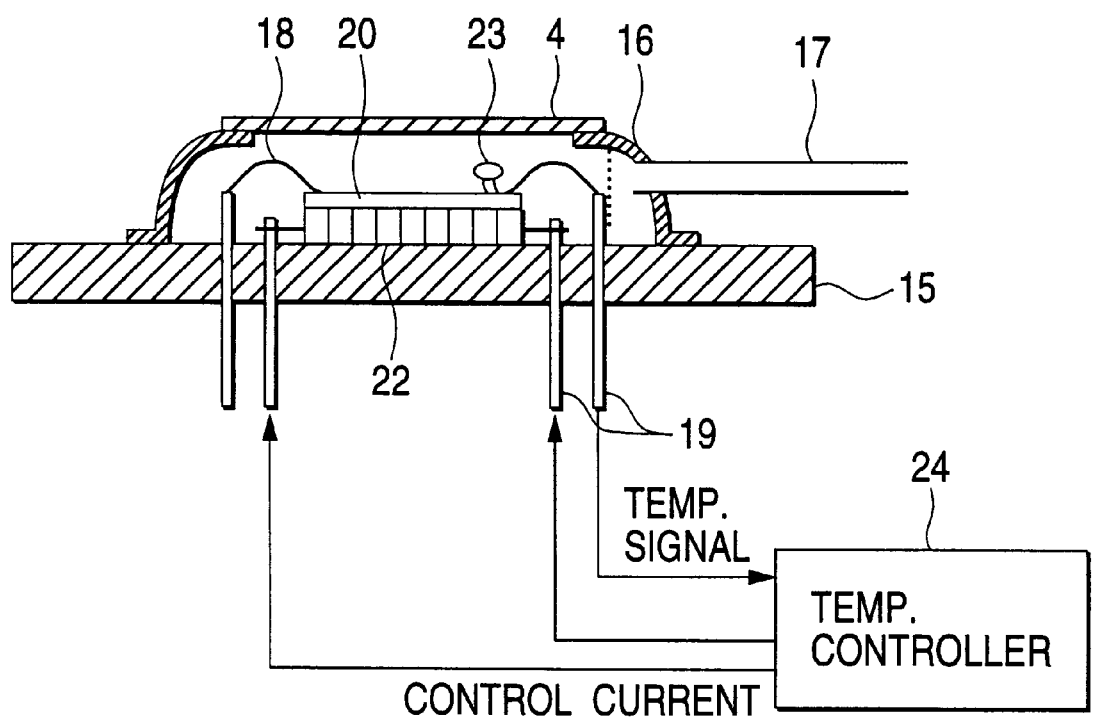
FIG. 15 is a sectional view to explain an infrared detector undergoing temperature stabilization in a conventional example.

FIG. 13 shows a sixth embodiment of the invention. To form an infrared detector of the sixth embodiment of the invention, an infrared transmission window 4 is bonded to a silicon substrate 1 formed with an infrared sensing array of a bolometer system in a similar manner to that in the first embodiment, thereby evacuating a light reception part of the detector of air, and further a positive temperature coefficient thermistor 26 is bonded to the silicon substrate 1 formed with the bolometer array.

In the sixth embodiment, the light reception part of the detector can be evacuated of air and be made airtight by a simple technique in the first embodiment and temperature control of the bolometer array can be easily performed by the positive temperature coefficient thermistor, so that the smallest infrared detector can be provided at low costs.

In the fourth to sixth embodiments, preferably the sudden resistance change temperature range of the positive temperature coefficient thermistor is 40 to 90° C. The lower limit of the temperature must be more than room temperature because temperature control of the invention is based on heat generation. Therefore, if the infrared detector of the invention is used only in cold districts, the lower limit of the temperature is not limited to 40° C. For the upper limit, a high temperature exceeding 90° C. greatly apart from the room temperature leads to an increase in power consumption and should be avoided; if the infrared detector is placed at a high temperature exceeding 110° C., the element may be broken.

According to the invention, there is provided an infrared detector comprising an infrared sensing array of a bolometer, thermo pile, or pyroelectric system formed with a light reception part on a substrate wherein an infrared transmission window is placed on the front of the light reception part with a cavity between and is bonded to the substrate in airtight relation on a bond face completely surrounding the light reception part, whereby the transmission window is fixed and the cavity is evacuated of air. Thus, the light reception part can be thermally insulated under vacuum without using a vacuum vessel, so that a small-sized and low-cost infrared detector can be provided.

If the infrared transmission window is made of silicon ground on both faces in the thickness range of 0.1 mm to 1.5 mm, a highly reliable infrared detector can be provided at low costs.

If the infrared transmission window is ground on both faces in the thickness range of 0.1 mm to 1.5 mm with both the faces each coated with a reflection prevention film, the transmission factor of the transmission window improves. Thus, a high-performance infrared detector excellent in sensitivity can be provided.

If the infrared transmission window is bonded to the substrate formed with the light reception part in airtight relation by solder, evaporation, etc., a highly reliable infrared detector can be provided.

If the degree of vacuum of the cavity between the infrared transmission window and the substrate formed with the light reception part is $1 \times 10^{-2}$ torr or less in the infrared detector, an infrared detector excellent in sensitivity can be provided.

If the infrared transmission window is formed with microlenses provided in a one-to-one correspondence with pixels of the detection array in the infrared detector, the light-gathering property of each pixel is enhanced. Thus, a high-performance infrared detector excellent in sensitivity can be provided.

According to the invention, there is provided an infrared sensor comprising a substrate formed with an infrared sensing array of a bolometer system, a positive temperature coefficient thermistor disposed on the substrate, and a vessel being made up of a cap with an infrared transmission window and a stem for fixing the substrate and the thermistor within the vessel, the vessel being evacuated of air. Thus, the infrared element temperature can be made constant simply by applying a voltage to the positive temperature coefficient thermistor without using a temperature sensor or a temperature controller.

According to the invention, there is provided an infrared sensor comprising a substrate formed with an infrared sensing array of a bolometer system, a vessel being made up of a cap with an infrared transmission window and a stem for fixing the substrate within the vessel, and a positive temperature coefficient thermistor disposed on the bottom of the stem, the vessel being evacuated of air. Thus, the infrared element temperature can be made constant simply by applying a voltage to the positive temperature coefficient thermistor without using a temperature sensor or a temperature controller.

According to the invention, there is provided an infrared detector comprising an infrared sensing array of a bolometer system as a light reception part formed on a first face of a substrate having two faces, wherein an infrared transmission window is placed on the front of the light reception part with a cavity between and is bonded to the substrate formed with the light reception part in airtight relation on a bond face completely surrounding the light reception part, whereby the transmission window is fixed and the cavity is evacuated of air, and wherein a positive temperature coefficient thermistor is bonded to a second face of the substrate. Thus, the light reception part of the detection element can be easily evacuated of air and be made airtight without using a vacuum vessel and the detection element temperature can be easily made constant by the positive temperature coefficient thermistor.

The sudden resistance change temperature range of the positive temperature coefficient thermistor is 40 to 90° C. and the element temperature is set higher than the room temperature. Thus, temperature control can be performed by the positive temperature coefficient thermistor. Since the upper limit of the temperature range is set to 90° C., the positive temperature coefficient thermistor consumes comparatively small power.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An infrared sensor comprising:

a substrate formed with an infrared sensing array of a bolometer system;

a positive temperature coefficient thermistor bonded to said substrate; and a vessel being made up of a cap with an infrared transmission window and a stem for fixing said substrate and said thermistor within said vessel, said vessel being evacuated of air, wherein a sudden resistance change temperature range of the positive temperature coefficient thermistor is 40 to 90° C.

2. An infrared sensor comprising:

a substrate formed with an infrared sensing array of a bolometer system;

a vessel being made up of a cap with an infrared transmission window and a stem for fixing said substrate within said vessel; and a positive temperature coefficient thermistor disposed on a bottom of the stem, said vessel being evacuated of air.

3. The infrared detector as claimed in claim 2 wherein a sudden resistance change temperature range of the positive temperature coefficient thermistor is 40 to 90° C.

4. An infrared detector comprising:

a substrate having first and second faces; and an infrared sensing array of a bolometer system as a light reception part formed on the first face of said substrate;

wherein an infrared transmission window is placed on a front of the light reception part with a cavity therebetween and is bonded to said substrate formed with the light reception part in airtight relation on a bond face completely surrounding the light reception part so that the transmission window is fixed and the cavity is evacuated of air; and wherein a positive temperature coefficient thermistor is bonded to the second face of said substrate and a sudden resistance change temperature range of the positive temperature coefficient thermistor is 40 to 90° C.

* * * * *